(12) United States Patent
Liu et al.

(10) Patent No.: US 8,828,823 B2
(45) Date of Patent: Sep. 9, 2014

(54) FINFET DEVICE AND METHOD OF MANUFACTURING SAME

(71) Applicant: Taiwan Semiconductor Manufacturing Company Ltd., Hsin-Chu (TW)

(72) Inventors: Chi-Wen Liu, Hsinchu (TW); Chao-Hsiung Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/243,457

(22) Filed: Apr. 2, 2014

(65) Prior Publication Data

US 2014/0206166 A1 Jul. 24, 2014

Related U.S. Application Data

(62) Division of application No. 13/272,305, filed on Oct. 13, 2011, now Pat. No. 8,723,236.

(51) Int. Cl.
*H01L 21/336* (2006.01)
*H01L 29/66* (2006.01)
*H01L 21/762* (2006.01)

(52) U.S. Cl.
CPC .... *H01L 29/66795* (2013.01); *H01L 21/76224* (2013.01)

USPC .................. 438/283; 257/288; 257/E29.424; 257/E21.409

(58) Field of Classification Search
USPC ............ 438/283; 257/288, E29.242, E21.409
See application file for complete search history.

(56) References Cited

U.S. PATENT DOCUMENTS 7,425,740 B2 * 9/2008 Liu et al. ........................ 257/306
7,646,046 B2 * 1/2010 Russ et al. ..................... 257/288

\* cited by examiner

*Primary Examiner* — Matthew W Such
*Assistant Examiner* — Monica D Harrison
(74) *Attorney, Agent, or Firm* — Haynes and Boone, LLP

(57) ABSTRACT

A semiconductor device and method for fabricating a semiconductor device is disclosed. An exemplary semiconductor device includes a substrate including a fin structure including one or more fins disposed on the substrate. The semiconductor device further includes a dielectric layer disposed on a central portion of the fin structure and traversing each of the one or more fins. The semiconductor device further includes a work function metal disposed on the dielectric layer and traversing each of the one or more fins. The semiconductor device further includes a strained material disposed on the work function metal and interposed between each of the one or more fins. The semiconductor device further includes a signal metal disposed on the work function metal and on the strained material and traversing each of the one or more fins.

20 Claims, 12 Drawing Sheets

FINFET DEVICE AND METHOD OF MANUFACTURING SAME

CROSS REFERENCE

This application is a divisional of U.S. patent application Ser. No. 13/272,305 filed on Oct. 13, 2011, entitled "A FinFET Device and Method Of Manufacturing Same," the disclosure of which is incorporated herein by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-like field effect transistor (FinFET) devices. Although existing FinFET devices and methods of fabricating FinFET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
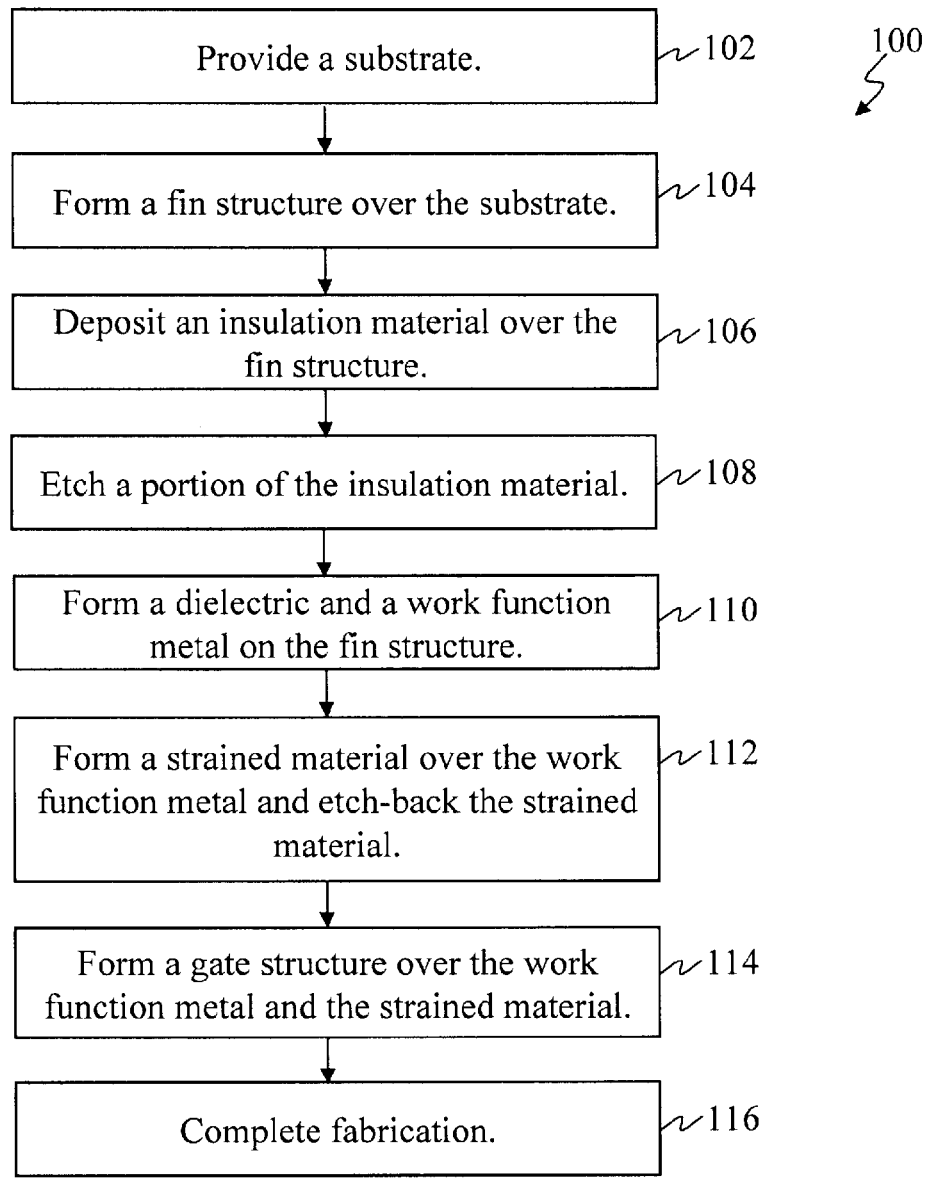
FIG. 1 is a flowchart illustrating a method of fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a fin-like field effect transistor (FinFET). The FinFET device, for example, may be a P-type metal-oxide-semiconductor (PMOS) FinFET device or a N-type metal-oxide-semiconductor (NMOS) FinFET device. The following disclosure will continue with a FinFET example to illustrate various embodiments of the present invention. It is understood, however, that the invention should not be limited to a particular type of device, except as specifically claimed.

With reference to FIGS. 1 and 2-10, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device that includes a fin-like field effect transistor (FinFET) device. The method 100 begins at block 102 where a substrate is provided. At block 104, a fin structure is formed over the substrate. The fin structure includes one or more fins each fin having first and second sidewalls. The formation of the fin structure may include patterning a mask layer and etching the semiconductor substrate using the mask layer. At block 106, an insulation material is deposited over the fin structure. The insulation material may be deposited such that it covers the fin structure. A planarizing process may be performed such that the top surface of the insulation material is planarized, exposing the top portion of the fin structure. The method continues with block 108 where an etching process is performed on the insulation material. The etching process includes etching back the insulation material such that the sidewalls of the fin structure are exposed. At block 110, a dielectric layer and a work function metal are formed over the fin structure. The method 100 continues with block 112 where a strained material is formed over the work function metal and an etch-back process is performed on the strained material. The etch-back process may include etching back the strained material between adjacent fins of the fin structure to expose sidewalls of the fin structure. At block 114, a signal metal is formed over the work function metal and the strained material. The method 100 continues with block 116 where fabrication of the integrated circuit device is completed. Additional steps can be provided before, during, and after the method 100, and some of the steps described can be replaced or eliminated for other embodiments of the method. The discussion that follows illustrates various embodiments of an integrated circuit device that can be fabricated according to the method 100 of FIG. 1.

FIGS. 2-9 illustrate diagrammatic cross-sectional side views of one embodiment of a semiconductor device at various stages of fabrication, according to the method of FIG. 1.

Figure 8:
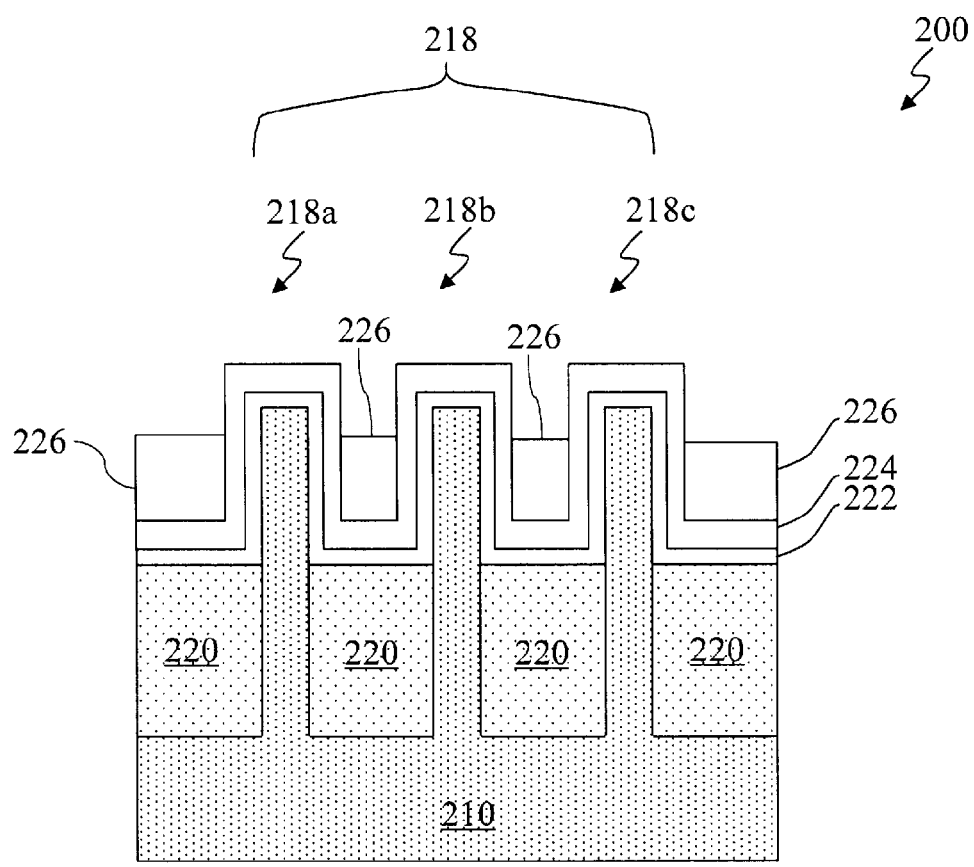
Figure 9:
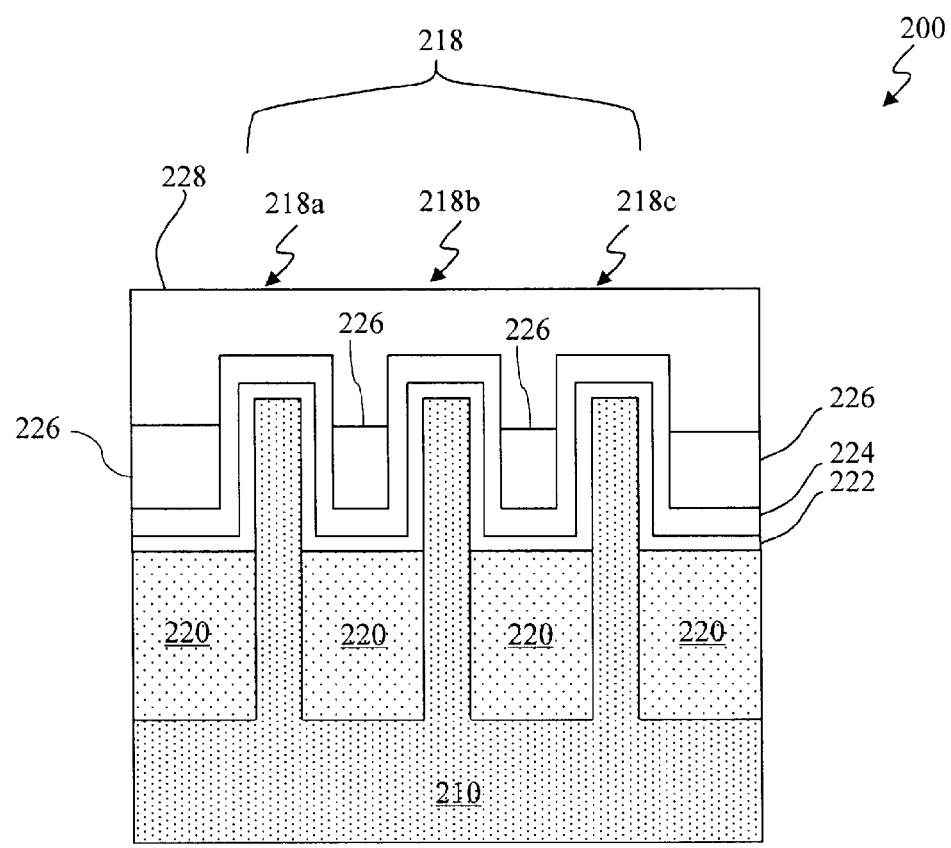
Figure 10:
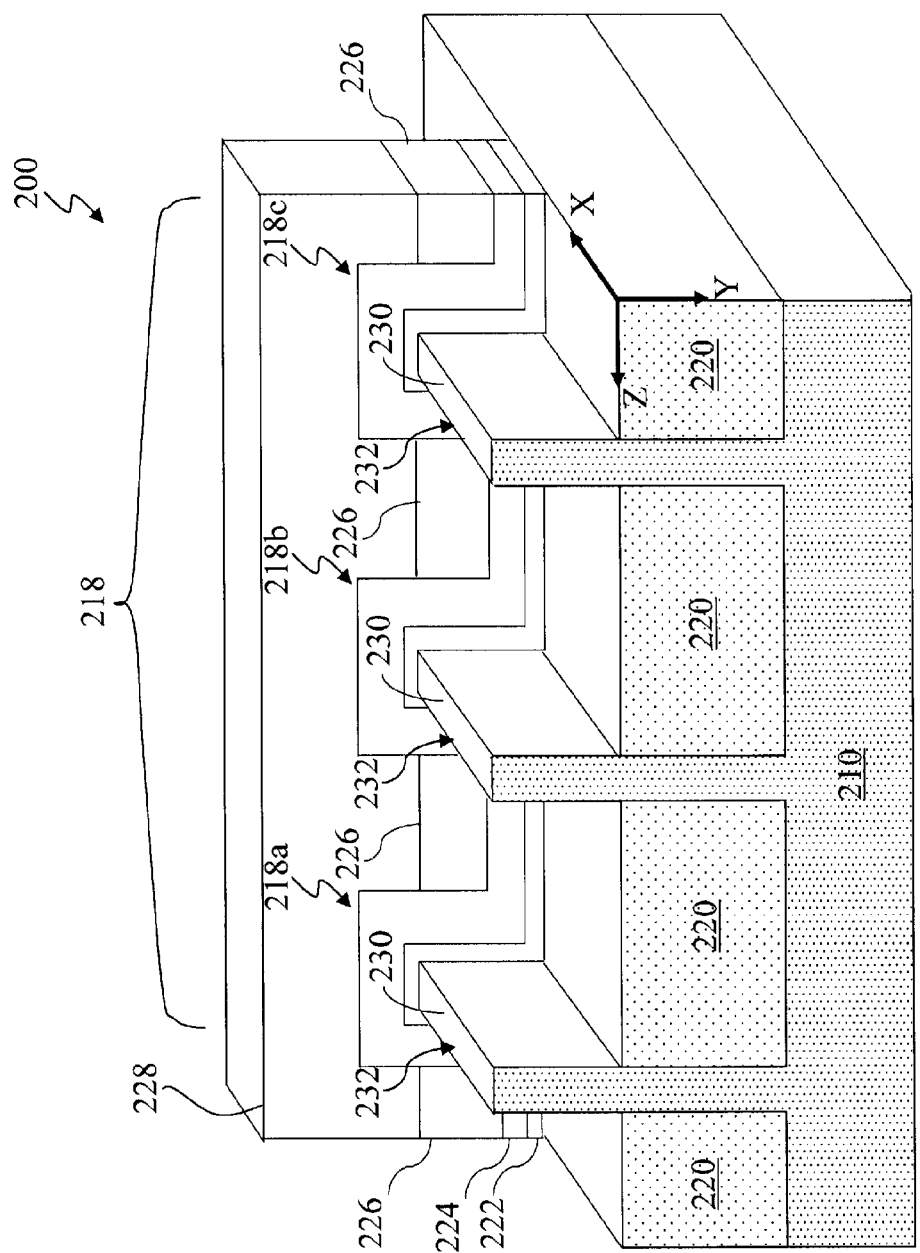
FIG. 10 illustrates a perspective view of one embodiment of the semiconductor device of FIGS. 2-9.

Additionally, FIG. 10 illustrates a perspective view of one embodiment of the semiconductor device of FIGS. 2-9. The FinFET device includes any fin-based, multi-gate transistor. The FinFET device 200 may be included in a microprocessor, memory cell, and/or other integrated circuit device. FIGS. 2-10 have been simplified for the sake of clarity to better understand the inventive concepts of the present disclosure. Additional features can be added in the FinFET device 200, and some of the features described below can be replaced or eliminated in other embodiments of the semiconductor device 200.

Figure 2:
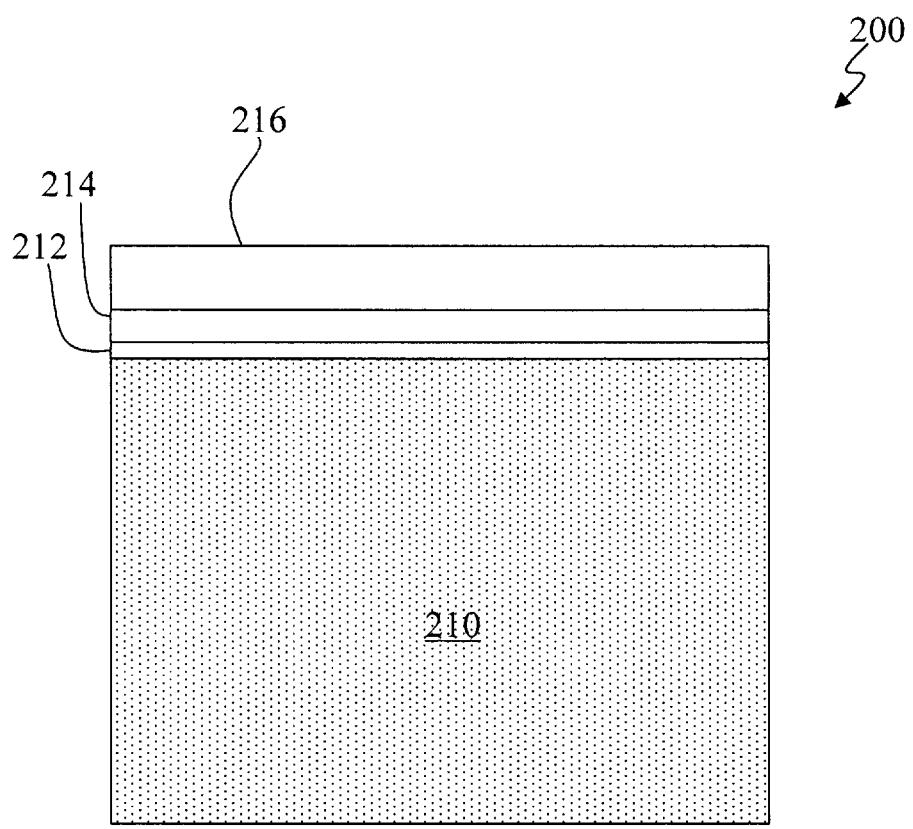
FIGS. 2-9 illustrate diagrammatic cross-sectional side views of one embodiment of a semiconductor device at various stages of fabrication, according to the method of FIG. 1.

Referring to FIG. 2, the FinFET device 200 includes a substrate (e.g., wafer) 210. The substrate 210 is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

With further reference to FIG. 2, formed over the substrate 210 is a dielectric layer 212. The dielectric layer 212 is formed by any suitable process to any suitable thickness. In the present embodiment, the dielectric layer 212 includes silicon oxide and is formed by a CVD or a thermal oxidation process. The thermal oxidation process may be a dry or a wet process. In various examples, the silicon oxide can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Formed over the dielectric layer 212 is a mask layer 214. In the present embodiment, the mask layer 214 includes silicon nitride and is formed by a CVD process. The mask layer 214 may be a stop/hard mask layer. The mask layer 214 is formed by any suitable process to any suitable thickness. The mask layer 214 may include a material such as silicon nitride, silicon oxide, silicon oxynitride, silicon carbide, silicon carbon nitride, other suitable material, or combinations thereof. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis (TertiaryButylAmino) Silane (BTBAS or C8H22N2Si) and Disilane (DS or Si2H6).

Formed over the mask layer 214 is a photoresist layer 216. The photoresist layer 216 is formed by any suitable process to any suitable thickness.

Figure 3:
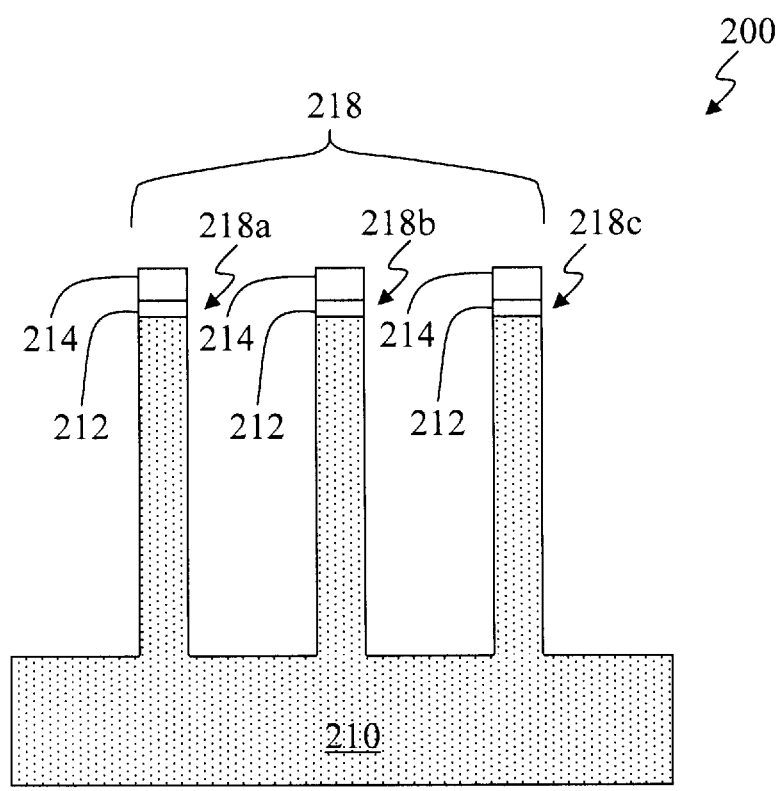

Referring to FIG. 3, fin structure 218 (including a plurality of fins 218a, 218b, and 218c each having first and second sidewalls) is formed by any suitable process, such as a photolithography and etching process. In the present embodiment, for example, the fin structure 218 is formed by exposing the photoresist layer 216 to a pattern, performing a post-exposure bake process, and developing the photoresist layer 216 to form a masking element including the photoresist layer 216 and the mask layer 214. The photoresist layer 216 patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. The masking element (including the photoresist layer 216 and the mask layer 214) may then be used in an etching process to etch the fin structure 218 into the substrate 210. The etching process uses the patterned mask layer 214 to define the area to be etched and to protect other regions of the FinFET device 200. The etching process may include a wet etching process, a dry etching process, or a combination thereof. The fin structure 218 may be formed by an etching process using a reactive ion etch (RIE) and/or other suitable process. In one example, a hydrofluoric acid (HF) or buffered HF may be used to etch the dielectric layer 212 to expose the substrate 210 according to the pattern defined by the mask layer 214. In one example, a dry etching process used to etch the substrate 210 includes a chemistry including fluorine-containing gas. In furtherance of the example, the chemistry of the dry etch includes CF4, SF6, or NF3. Alternatively, the fin structure 218 is formed by a double-patterning lithography (DPL) process. DPL is a method of constructing a pattern on a substrate by dividing the pattern into two interleaved patterns. DPL allows enhanced feature (e.g., fin) density. Various DPL methodologies may be used including double exposure (e.g., using two mask sets).

Figure 4:
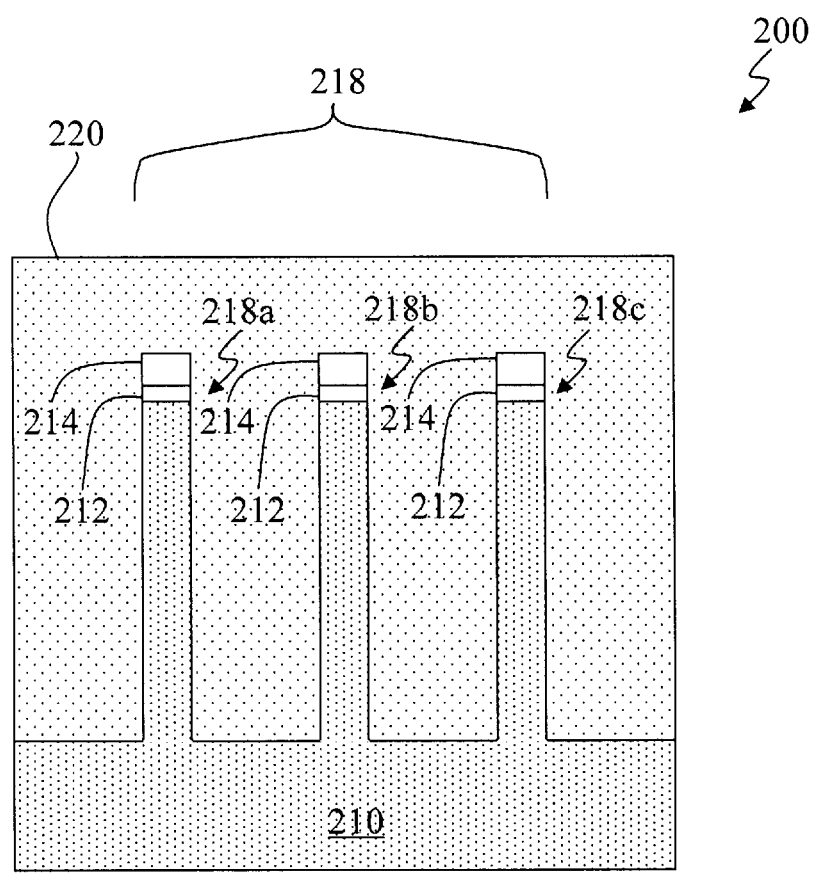

Referring to FIG. 4, deposited over the substrate 210 (and over the fin structure 218) is an insulation material 220. The insulation material 220 is deposited such that the insulation material 220 surrounds and isolates each fin 218a,b,c of the fin structure 218 from other fins. The insulation material 220 may include an insulating material such as silicon oxide, silicon nitride, silicon oxynitride, low k materials, air gap, other suitable material, or combinations thereof. In the present embodiment, the insulation material 220 includes silicon oxide. The silicon oxide can be deposited by a CVD process. In various examples, the silicon oxide can be formed by physical vapor deposition (PVD), atomic layer deposition (ALD), high density plasma CVD (HDPCVD), other suitable methods, and/or combinations thereof. The silicon oxide may be alternatively formed by a high aspect ratio process (HARP). In various embodiments, an optional thermal oxide trench liner may be grown to improve the trench interface. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6). The insulation material 220 may have a multi-layer structure, for example, a thermal oxide liner layer with silicon nitride formed over the liner.

Figure 5:
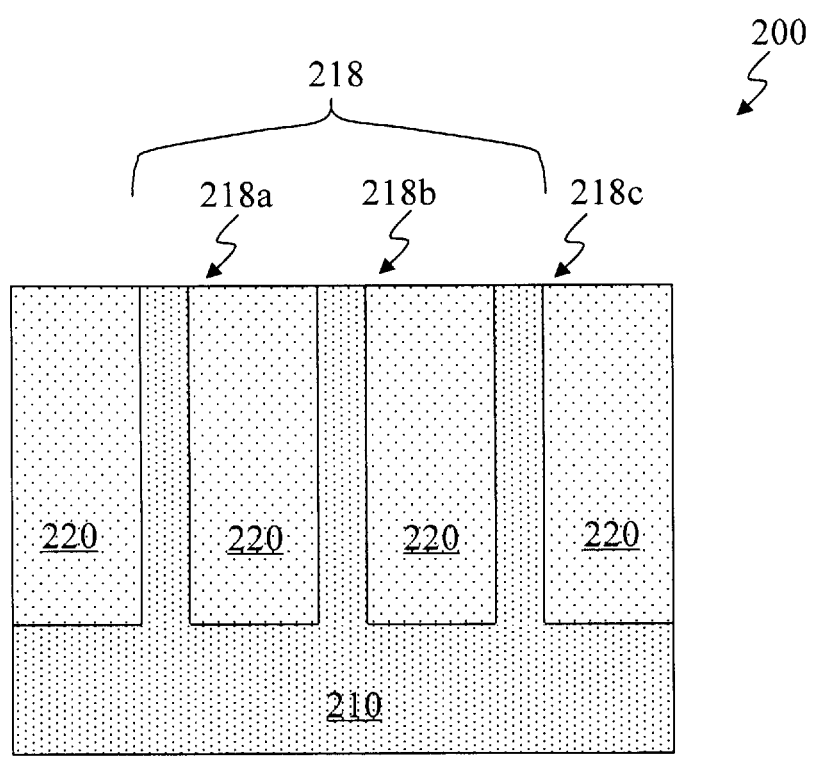

Referring to FIG. 5, a planarizing process is performed on the FinFET device 200. In one embodiment, the planarizing process includes a chemical mechanical polishing (CMP) process applied to the FinFET device 200 to remove excessive portions of the insulation material 220. The planarizing process may be performed such that the dielectric layer 212 is removed, thus exposing the top of the fin structure 218.

Figure 6:
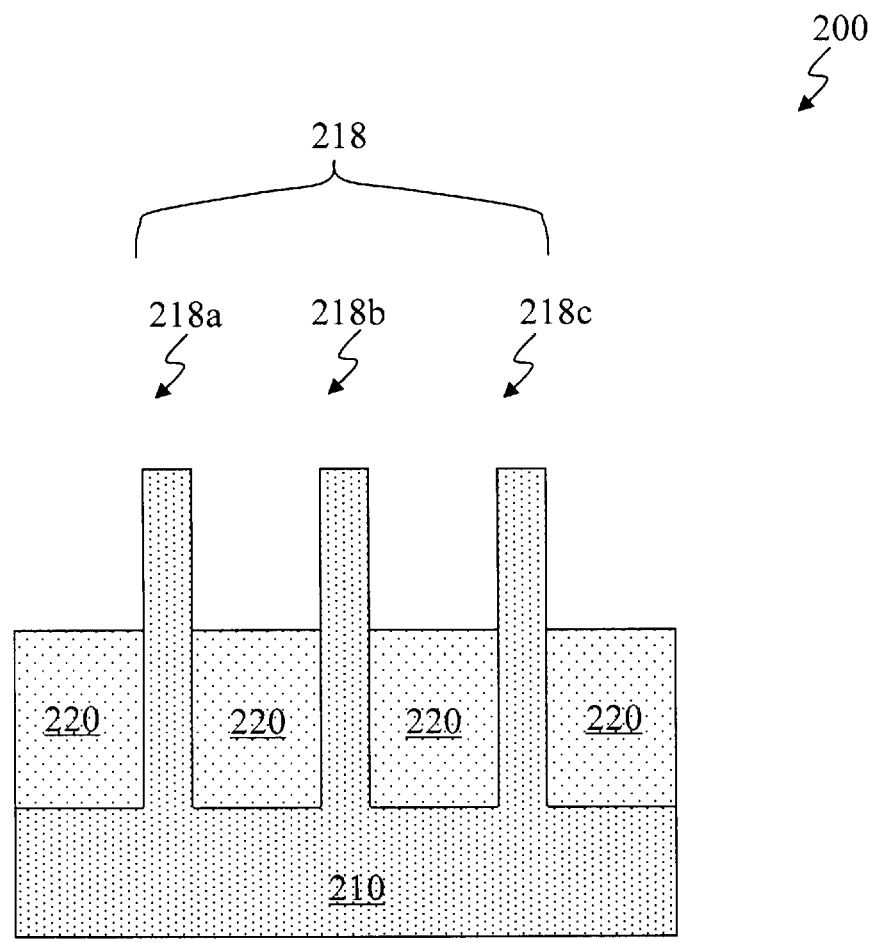

Referring to FIG. 6, an etching process is used to etch-back excessive insulation material 220 in a central region of the FinFET device 200, thus exposing a portion of the first and second sidewalls of each fin of the fin structure 218. The etching process may include a wet etching, a dry etching process, or a combination thereof. In one example, a dry etching process may include forming a photoresist layer, patterning the photoresist layer, etching the insulation material 220, and removing the photoresist layer. In furtherance of the example, the dry etching process used to etch the isolation material may include a chemistry including fluorine-containing gas. In furtherance of the example, the chemistry of the dry etch includes CF4, SF6, or NF3.

Figure 7:
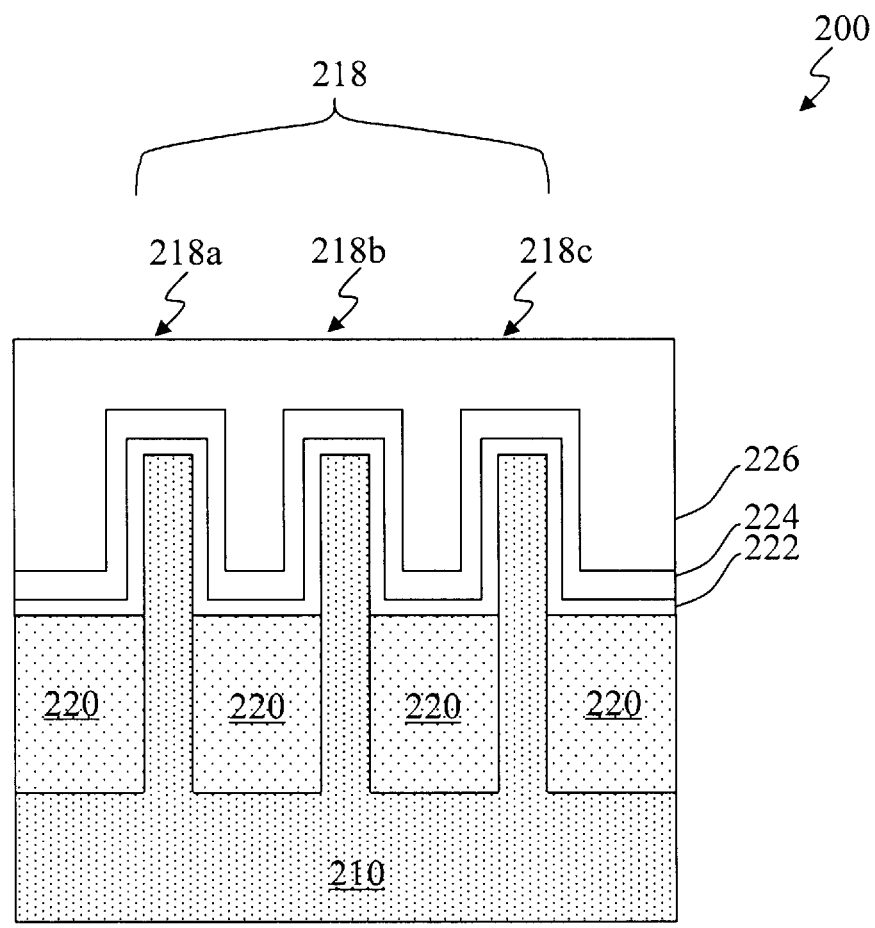

Referring to FIG. 7, the FinFET device 200 includes a dielectric layer 222. The dielectric layer 222 is formed on a central portion of the fin structure 218 and traverses each fin 218a,b,c, of the fin structure 218. In some embodiments, the dielectric layer 222 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the dielectric layer 222 is a high-k dielectric layer comprising HfOx. The dielectric layer 222 may be formed using a suitable process such as atomic layer deposition (ALD), chemical vapor deposition (CVD), physical vapor deposition (PVD), thermal oxidation, UV-ozone oxidation, or combinations thereof. The dielectric layer 222 may further comprise an interfacial layer (not shown) to reduce damage between the dielectric layer 222 and the substrate 210. The interfacial layer may comprise silicon oxide.

Still referring to FIG. 7, the FinFET device 200 further includes a work function metal 224 formed on the dielectric layer 222 and traversing each fin 218a,b,c, of the fin structure 218. The work function metal 224 may be formed by any suitable process to any suitable thickness. The work function metal 224 includes metals such as Al, Cu, Ti, Ta, W, Mo, TaN, NiSi, CoSi, TiN, WN, TiAl, TiAlN, TaCN, TaC, TaSiN, other conductive materials, or combinations thereof. The work function metal 224 is formed by any suitable deposition process. For example, the deposition processes includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

With continued reference to FIG. 7, the FinFET device 200 includes a strained material 226 formed over the work function metal 224. The strained material 226 may be formed such that it is interposed between and substantially fills the regions between each fin 218a,b,c, of the fin structure 218 of the FinFET device 200. The strained material 226 is selected such that it has a different coefficient of thermal expansion (CTE) than that of the work function metal 224. Also, the strained material 226 may be selected such that it has a different CTE than that of a subsequently formed signal metal (see FIG. 9, item 228). The CTE of the strained material 226 may be either less than or greater than a CTE of the signal metal. The strained material 226 may include a dielectric material or a metal material. For example, the strained material 226 may include a dielectric such as polymide (PI), an air gap, a metal such as titanium silicide (TiSi), or any other suitable dielectric or metal materials. As will be discussed below, the strained material 226 is chosen such that it either induces a compressive strain or a tensile strain in a current flow direction of the channel region.

The strained material 226 is formed by any suitable process. In the present embodiment, the strained material 226 is formed by a spin-on process. Alternatively the strained material 226 is formed by a process including chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof.

The process for forming the strained material 226 may include utilizing any suitable process temperature ($T_p$) such that a volume expansion difference between the strained material 226 and the work function metal 224 is experienced at an operating temperature ($T_o$). In the present embodiment, the process temperature ($T_p$) includes a temperature lower than the operating temperature ($T_o$) of the FinFET device 200. Alternatively, the process temperature ($T_p$) includes a temperature greater than the operating temperature ($T_o$) of the FinFET device 200. The process temperature ($T_p$) may be a temperature that is utilized by other process or a temperature that is not utilized by other processes. For example, the process that forms the work function metal 224 may or may not utilize the process temperature ($T_p$). Whether or not other process utilize the process temperature ($T_p$) is based on design requirements and desired stress characteristics of the FinFET device 200. As understood, the processes that form other structures/layers of the FinFET device 200 may utilize temperatures greater than the process temperature ($T_p$). As further understood, the processes that form other structures/layers of the FinFET device 200 may utilize temperatures less than the process temperature ($T_p$).

In the present embodiment, for example, the process that forms the strained material 226 uses a process temperature ($T_p$) of about room temperature (e.g., about 20 to about 30 degrees Celsius). Further, the process that forms the work function metal 224 utilizes a temperature substantially the same as the process temperature ($T_p$). During operation, at an initial operating temperature ($T_o$) of about room temperature (e.g., when the FinFET device is initially turned on), the strained material 226 will induce about zero stress in the channel region because the volume expansion difference between the work function metal 224 and the strained material 226 is about zero. At a final operating temperature ($T_o$) (e.g., when the FinFET device 200 is powered on for a period of time) a volume expansion difference between the work function metal 224 and the strained material 226 is experienced. The volume expansion difference allows the strained material 226 to induce a stress in the channel region of the fins 218a,b,c, of the fin structure 218. The volume expansion difference between the work function metal 224 and the strained material 226 is a function of the CTE of each material. The volume expansion difference may be positive (i.e., the strained material 226 expands more than the work function metal 224 as the operating temperature ($T_o$) increases). Alternatively, the volume expansion difference may be negative (i.e., the strained material 226 expands less than the work function metal 224 as the operating temperature ($T_o$) increases). Accordingly, the stress induced in the channel region by the strained material 226 at any operating temperature ($T_o$) is a function of the process temperature ($T_p$), the CTE of the work function metal 224, and the CTE of the strained material 226.

In alternative embodiments, the process temperature ($T_p$) includes a temperature greater than the operating temperature ($T_o$) of the FinFET device 200. In such embodiments, for example, the process that forms the strained material 226 uses a process temperature ($T_p$) of about 400 degrees Celsius. At an initial operating temperature ($T_o$) of about room temperature (e.g., when the FinFET device is initially turned on), the strained material 226 will induce a maximum stress in the channel region because the volume expansion difference between the work function metal 224 and the strained material 226 is at a maximum. At a final operating temperature ($T_o$) (e.g., when the FinFET device 200 is powered on for a period of time) a volume expansion difference between the work function metal 224 and the strained material 226 will become less than the maximum. As the operating temperature ($T_o$) approaches the process temperature ($T_p$) of about 400 degrees Celsius, the volume expansion difference approaches zero and the stress induced by the strained material approaches zero. The volume expansion difference allows the strained material 226 to induce a stress in the channel region of the fins 218a,b,c, of the fin structure 218. Accordingly, the stress induced in the channel region by the strained material 226 at any operating temperature ($T_o$) is a function of the process temperature ($T_p$), the CTE of the work function metal 224, and the CTE of the strained material 226.

Referring to FIG. 8, the strained material 226 is recessed within the regions between each fin 218a,b,c, of the fin structure 218. In the present embodiment, for example, recessing of the strained material 226 is performed by an etching process. The etching process may include a wet etching or dry etching process, or a combination thereof. In one example, the dry etching process used to etch the strained material 226 may include a chemistry including fluorine-containing gas. In furtherance of the example, the chemistry of the dry etch includes CF4, SF6, NF3, or any suitable chemistry appropriate for the strained material 226. The wet etching process may include a chemistry including HCl, HF, or any suitable chemistry appropriate for the strained material 226.

Referring to FIG. 9, formed over the work function metal 224 and the strained material 226 is a signal metal 228. The signal metal 228 traverses each fin 218a,b,c, of the fin structure 218 and separates source and drain (S/D) regions of the FinFET device 200. For each fin 218a,b,c, of the fin structure 218, the S/D regions define a channel region therebetween. The signal metal 228 include any suitable conductive material. For example, the signal metal 228, include Al, Cu, Mo, other conductive materials, or combinations thereof. The signal metal 228 may include numerous other layers, for example, capping layers, interface layers, diffusion layers, barrier layers, or combinations thereof. A hard mask layer may be formed over the signal metal 228. The hard mask layer may include silicon oxide, silicon nitride, silicon oxynitride, silicon carbide, other suitable material, or combinations thereof.

The signal metal 228 is formed by a suitable process, including deposition, lithography patterning, and etching processes. The deposition processes include chemical vapor deposition (CVD), physical vapor deposition (PVD), atomic layer deposition (ALD), high density plasma CVD (HD-PCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography exposing process is implemented or replaced by other methods, such as maskless photolithography, electron-beam writing, and ion-beam writing. In yet another alternative, the lithography patterning process could implement nanoimprint technology. The etching processes include dry etching, wet etching, and/or other etching methods.

FIG. 10 illustrates a perspective view of one embodiment of the semiconductor device of FIGS. 2-9. Referring to FIG. 10, the FinFET device 200 includes a substrate 210, a fin structure 218 including a plurality of fins 218a,b,c, an insulation material 220, a dielectric layer 222, a work function metal 224, a strained material 226, and a signal metal 228. Further, the FinFET device 200 further includes source and drain (S/D) features 230 formed in S/D regions 232 of the fin structure 218. For each fin 218a,b,c, of the fin structure 218, the S/D regions 232 define a channel region therebetween. Forming the S/D features 230 may include recessing a portion of each of the one or more fins 218a,b,c, and epitaxially (epi) growing a semiconductor material on the recessed portions of each of the one or more fins 218,a,b,c. The S/D features 230 may be doped by adding impurities to the semiconductor material or by an ion implantation process. For example, the S/D regions 232 may be doped with phosphorous. The doped S/D regions 232 may have a gradient doping profile. Prior to or after forming the S/D features 232, implantation, diffusion, and/or annealing processes may be performed to form heavily doped S/D (HDD) features in the S/D regions 232 of the FinFET device 200, of a p-type if the FinFET device 200 is a PMOS device, or of an n-type if the FinFET device 200 is an NMOS device.

Figure 11:
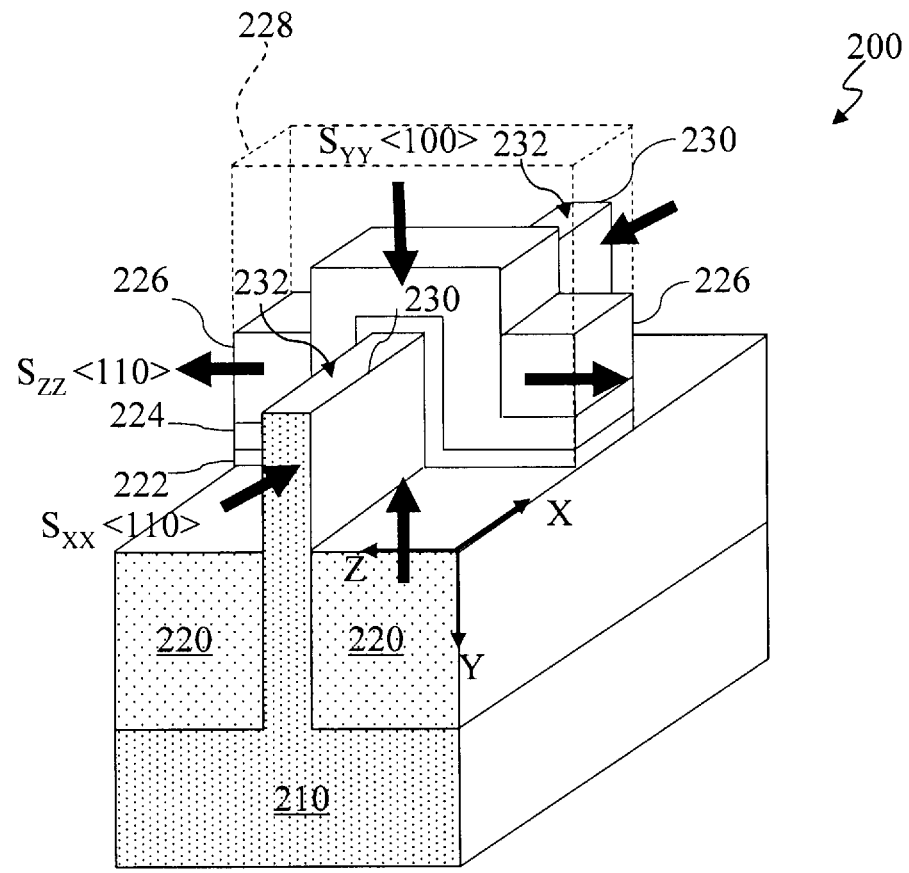
FIG. 11 illustrates a partial perspective view of one embodiment of the semiconductor device of FIGS. 2-9 and the direction of stress forces.

FIG. 11 illustrates a partial perspective view of one embodiment of the semiconductor device of FIGS. 2-9 and the direction of stress forces. Referring to FIG. 11, the FinFET device 200 is a PMOS device. In the depicted embodiment, during operation, the PMOS FinFET device 200 experiences enhanced carrier mobility when the CTE of the work function metal 224 is greater than the CTE of the strained material 226. For example, the work function metal 224 includes TiN (which has an average CTE of about $9.35 \times 10^{-6}$ $K^{-1}$) and the strained material 226 includes TiSi (which has an average CTE of about $5.28 \times 10^{-6}$ $K^{-1}$). As the operating temperature ($T_o$) of the PMOS FinFET device 200 increases during operation, the strained material 226 volume expansion becomes less than the volume expansion of the work function metal 224, thereby inducing a tensile stress in the Szz<110> direction and a compressive stress in the current flow Sxx<110> direction of the PMOS FinFET device 200. In such an embodiment, the process that forms the strained material 226 is carried out such that the strained material 226 induces about a zero stress in the channel region in the Szz<110> direction at an operating temperature ($T_o$) of about room temperature. It is understood that the stress in the channel region of the PMOS FinFET device 200 can be tuned by adjusting the strained material 226 formation process including the process temperature ($T_p$) and by selecting different combinations of materials for the work function metal 224 and the strained material 226 that have different CTE characteristics, thereby adjusting the volume expansion difference of the work function metal 224 and the strained material 226 at the operating temperature ($T_o$).

Figure 12:
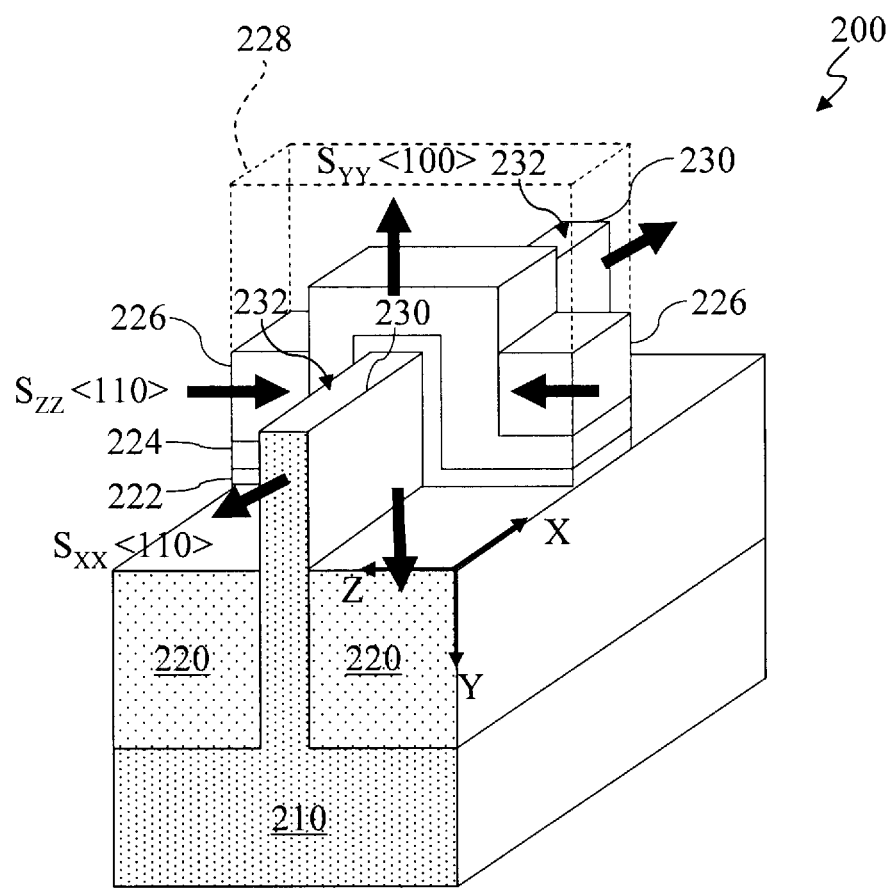
FIG. 12 illustrates a partial perspective view of one embodiment of the semiconductor device of FIGS. 2-9 and the direction of stress forces.

FIG. 12 illustrates a partial perspective view of one embodiment of the semiconductor device of FIGS. 2-9 and the direction of stress forces. Referring to FIG. 12, the FinFET device 200 is a NMOS device. In the depicted embodiment, the NMOS FinFET device 200 experiences enhanced carrier mobility when the CTE of the work function metal 224 is less than the CTE of the strained material 226. For example, the work function metal 224 includes TiAl (which has an average CTE of about $12.3 \times 10^{-6}$ $K^{-1}$) and the strained material 226 includes PI (which has an average CTE of about $61 \times 10^{-6}$ $K^{-1}$) and may further include an air gap. As the operating temperature ($T_o$) of the NMOS FinFET device 200 increases during operation, the strained material 226 volume expansion becomes greater than the volume expansion of the work function metal 224, thereby inducing a compressive stress in the Szz<110> direction and a tensile stress in the current flow Sxx<110> direction of the NMOS FinFET device 200. In such an embodiment, the process that forms the strained material 226 is carried out such that the strained material 226 induces about a zero stress in the channel region in the Szz<110> direction at an operating temperature ($T_o$) of about room temperature. It is understood that the stress in the channel region of the NMOS FinFET device 200 can be tuned by adjusting the strained material 226 formation process including the process temperature ($T_p$) and by selecting different combinations of materials for the work function metal 224 and the strained material 226 that have different CTE characteristics, thereby adjusting the volume expansion difference of the work function metal 224 and the strained material 226 at the operating temperature ($T_o$).

A benefit of the method 100 and FinFET device 200 is that the strained material 226 induces one of a compressive or a tensile stress in the current flow direction of the FinFET device 200. The induced compressive/tensile stress results in an increased/higher strain to the channel region of the FinFET device 200, when compared to traditional FinFET devices, thereby improving carrier mobility of the FinFET device 200. Further, the method disclosed for achieving the strained structure, described herein, is easily implemented into current processing. Different embodiments may have different advantages, and no particular advantage is necessarily required of any embodiment.

The FinFET device 200 may include additional features, which may be formed by subsequent processing. For example, various contacts/vias/lines and multilayer interconnect features (e.g., metal layers and interlayer dielectrics) may be formed over the substrate 210, configured to connect the various features or structures of the FinFET device 200. The additional features may provide electrical interconnection to the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Thus, provided is a semiconductor device. An exemplary semiconductor device includes a substrate including a fin structure disposed over the substrate. The fin structure includes one or more fins. The semiconductor device further includes an insulation material disposed on the substrate in a region between each of the one or more fins. The semiconductor device further includes a dielectric layer traversing each of the one or more fins and on the insulation material in the region between each of the one or more fins. Also, the semiconductor device includes a work function metal traversing each of the one or more fins and on the dielectric layer in the region between each of the one or more fins. The semiconductor device further includes a strained material disposed on the work function metal in the region between each of the one or more fins. Further, the semiconductor device includes a signal metal formed over the work function metal and the strained material, and traversing each of the one or more fins.

In some embodiments, the strained material has a coefficient of thermal expansion (CTE) that is different than a CTE of the work function metal and a CTE of the signal metal. The signal metal separates source and drain regions of the semiconductor device. The source and drain regions define a channel region, for each of the one or more fins, therebetween. In certain embodiments, the strained material induces a compressive stress in a current flow direction of the channel region, for each of the one or more fins. In various embodiments, the strained material induces a tensile stress in a current flow direction of the channel region, for each of the one or more fins. In certain embodiments, the substrate is selected from the group consisting of bulk silicon and silicon-on-insulator (SOI). In further embodiments, the semiconductor device is one of a P-type metal-oxide-semiconductor (PMOS) fin-like field effect transistor (FinFET) device or a N-type metal-oxide-semiconductor (NMOS) FinFET device, and the semiconductor device is included in an integrated circuit device. In some embodiments, the strained material is selected from the group consisting of a dielectric material and a metal material. In further embodiments, the strained material is selected from the group consisting of polyimide (PI), an air gap, and titanium silicide (TiSi), and the work function metal is selected from the group consisting of titanium nitride (TiN) and titanium aluminide (TiAl).

Also provided is an alternative embodiment of a semiconductor device. The exemplary semiconductor device includes a substrate. The semiconductor device further includes a fin structure including one or more fins disposed over the substrate. The semiconductor device further includes a dielectric layer disposed on a central portion of the fin structure and traversing each of the one or more fins. The semiconductor device further includes a work function metal disposed on the dielectric layer and traversing each of the one or more fins. The semiconductor device further includes a strained material disposed on the work function metal and interposed between each of the one or more fins. The semiconductor device further includes a signal metal disposed on the work function metal and the strained material and traversing each of the one or more fins.

In some embodiments, the signal metal separates source and drain regions of the semiconductor device, the source and drain regions defining a channel region, for each of the one or more fins, therebetween. The strained material induces a compressive stress in a current flow direction of the channel region of at least one fin of the one or more fins of the fin structure. The strained material has a coefficient of thermal expansion (CTE) that is less than a CTE of the work function metal and different than a CTE of the signal metal. In various embodiments, the signal metal separates source and drain regions of the semiconductor device, the source and drain regions defining a channel region, for each of the one or more fins, therebetween. The strained material induces a tensile stress in a current flow direction of the channel region of at least one fin of the one or more fins of the fin structure. The strained material has a coefficient of thermal expansion (CTE) that is greater than a CTE of the work function metal and different than a CTE of the signal metal. In certain embodiments, the semiconductor device is a P-type metal-oxide-semiconductor (PMOS) fin-like field effect transistor (FinFET) device. In other embodiments, the semiconductor device is a N-type metal-oxide-semiconductor (NMOS) fin-like field effect transistor (FinFET) device.

Also provided is a method. The method includes providing a substrate and forming a fin structure including one or more fins over the substrate, each of the one or more fins including first and second sidewalls. The method further includes depositing an insulation material on the substrate and the fin structure. The insulation material substantially fills a region between each of the one or more fins. The method further includes removing a portion of the insulation material from the region between each of the one or more fins such that a portion of the first and second sidewalls of each of the one or more fins is exposed. The method further includes forming a dielectric layer over a central portion of each of the one or more fins. The method further includes forming a work function metal over the dielectric layer and disposed in the region between each of the one or more fins. The method further includes forming a strained material on the work function metal. The strained material is disposed in the region between each of the one or more fins. The method further includes etching back the strained material in the region between each of the one or more fins.

In some embodiments, the method further includes forming a signal metal over the work function metal and the etched back strained material. The signal metal traverses each of the one or more fins and separates source and drain regions of the semiconductor device. The source and drain regions define a channel region, for each of the one or more fins, therebetween. The method further includes forming source and drain features in the source and drain regions. Forming the source and drain features includes recessing a portion of each of the one or more fins and epitaxially (epi) growing a semiconductor material on the recessed portions of each of the one or more fins.

In some embodiments, forming the strained material includes a spin-on process and a process temperature less than an operating temperature of the semiconductor device. In certain embodiments, forming the strained material includes a spin-on process and a process temperature greater than an operating temperature of the semiconductor device. In further embodiments, forming the strained material includes depositing a metal material having a coefficient of thermal expansion (CTE) less than a CTE of the work function metal. In some embodiments, forming the strained material includes depositing a dielectric material having a coefficient of thermal expansion (CTE) greater than a CTE of the work function metal. In further embodiments, forming the strained material includes depositing a material having a coefficient of thermal expansion (CTE) less than a CTE of the work function metal and different than a CTE of the signal metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising:
   forming a plurality of fins over a substrate;
   forming an insulation material in a region between the plurality of fins;
   forming a dielectric layer over the plurality of fins and over the insulation material in the region between the plurality of fins;
   forming a work function metal over the plurality of fins and over the dielectric layer in the region between the plurality of fins;
   forming a strained material over the work function metal in the region between the plurality of fins; and
   forming a signal metal over the plurality of fins, over the work function metal, and over the strained material.

2. The method of claim 1 wherein the strained material has a coefficient of thermal expansion (CTE) that is different than a CTE of the work function metal and a CTE of the signal metal, and
   wherein the signal metal separates source and drain regions of the semiconductor device, the source and drain regions defining channel regions of the plurality of fins.

3. The method of claim 2 wherein the strained material induces a compressive stress in a current flow direction of the channel regions.

4. The method of claim 2 wherein the strained material induces a tensile stress in a current flow direction of the channel regions.

5. The method of claim 1 wherein the semiconductor device is one of a P-type metal-oxide-semiconductor (PMOS) fin-like field effect transistor (FinFET) device or a N-type metal-oxide-semiconductor (NMOS) FinFET device, and wherein the semiconductor device is included in an integrated circuit device.

6. The method of claim 1 wherein the strained material is selected from the group consisting of a dielectric material and a metal material.

7. The method of claim 1 wherein the strained material includes titanium silicide (TiSi) and the work function metal includes titanium nitride (TiN).

8. The method of claim 1 wherein the strained material includes polyimide (PI) and the work function metal includes titanium aluminide (TiAl).

9. A method of forming a semiconductor device comprising:
   forming first and second fins over a substrate;
   depositing a dielectric layer over a central portion of the first and second fins;
   depositing a work function metal over the dielectric layer and over the first and second fins;
   depositing a strained material over the work function metal and interposed between the first and second fins; and
   depositing a signal metal over the work function metal and over the strained material, the signal metal traversing the first and second fins.

10. The method of claim 9 wherein the signal metal separates source and drain regions of the semiconductor device, the source and drain regions defining channel regions of the first and second fins,
    wherein the strained material induces a compressive stress in a current flow direction of the channel regions, and
    wherein the strained material has a coefficient of thermal expansion (CTE) that is less than a CTE of the work function metal and different than a CTE of the signal metal.

11. The method of claim 10 wherein the semiconductor device is a P-type metal-oxide-semiconductor (PMOS) fin-like field effect transistor (FinFET) device.

12. The method of claim 9 wherein the signal metal separates source and drain regions of the semiconductor device, the source and drain regions defining channel regions of the first and second fins,
    wherein the strained material induces a tensile stress in a current flow direction of the channel regions, and
    wherein the strained material has a coefficient of thermal expansion (CTE) that is greater than a CTE of the work function metal and different than a CTE of the signal metal.

13. The method of claim 12 wherein the semiconductor device is a N-type metal-oxide-semiconductor (NMOS) fin-like field effect transistor (FinFET) device.

14. A method of manufacturing a semiconductor device, comprising:
  providing a substrate;
  forming a fin structure including one or more fins over the substrate, each of the one or more fins including first and second sidewalls;
  depositing an insulation material on the substrate and the fin structure, the insulation material substantially filling a region between each of the one or more fins;
  removing a portion of the insulation material from the region between each of the one or more fins such that a portion of the first and second sidewalls of each of the one or more fins is exposed;
  forming a dielectric layer over a central portion of each of the one or more fins;
  forming a work function metal over the dielectric layer and disposed in the region between each of the one or more fins;
  forming a strained material on the work function metal, the strained material being disposed in the region between each of the one or more fins; and
  etching back the strained material in the region between each of the one or more fins.

15. The method of claim 14 further comprising:
  forming a signal metal over the work function metal and the etched back strained material, the signal metal traversing each of the one or more fins and separating source and drain regions of the semiconductor device, the source and drain regions defining a channel region, for each of the one or more fins, therebetween; and
  forming source and drain features in the source and drain regions,
  wherein forming the source and drain features includes recessing a portion of each of the one or more fins and epitaxially (epi) growing a semiconductor material on the recessed portions of each of the one or more fins.

16. The method of claim 14 wherein forming the strained material includes:
  a spin-on process; and
  a process temperature less than an operating temperature of the semiconductor device.

17. The method of claim 16 wherein forming the strained material includes depositing a metal material having a coefficient of thermal expansion (CTE) less than a CTE of the work function metal.

18. The method of claim 16 wherein forming the strained material includes depositing a dielectric material having a coefficient of thermal expansion (CTE) greater than a CTE of the work function metal.

19. The method of claim 14 wherein forming the strained material includes:
  a spin-on process; and
  a process temperature greater than an operating temperature of the semiconductor device.

20. The method of claim 19 wherein forming the strained material includes depositing a material having a coefficient of thermal expansion (CTE) less than a CTE of the work function metal and different than a CTE of the signal metal.

* * * * *